United States Patent
Watson et al.

(10) Patent No.: US 6,239,924 B1
(45) Date of Patent: May 29, 2001

(54) KINEMATIC LENS MOUNTING WITH DISTRIBUTED SUPPORT AND RADIAL FLEXURE

(75) Inventors: Douglas C. Watson, Campbell; W. Thomas Novak, Hillsborough, both of CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/386,255

(22) Filed: Aug. 31, 1999

(51) Int. Cl.$^7$ ...................................................... G02B 7/02
(52) U.S. Cl. ............................ 359/819; 359/818; 359/811
(58) Field of Search .................................... 359/819, 811, 359/818, 804, 820

(56) References Cited

U.S. PATENT DOCUMENTS

| | | | |
|---|---|---|---|
| 2,937,571 | 5/1960 | Thompson | 88/57 |
| 3,601,343 | 8/1971 | Sivaslian et al. | 248/2 |
| 4,726,671 | 2/1988 | Ahmad et al. | 350/633 |
| 4,733,945 | 3/1988 | Bacich | 350/253 |
| 4,929,054 | 5/1990 | Ahmad et al. | 350/252 |
| 5,428,482 * | 6/1995 | Bruning et al. | 359/827 |

FOREIGN PATENT DOCUMENTS 11-149029   6/1999   (JP).

OTHER PUBLICATIONS

English language translation of Japanese Patent Publication No. 11-149029, Jun. 2, 1999.

Erik Hog, "A Kinematic Mounting", *Copenhagen University Astronomy & Astrophysics,* pp. 107–109, 1975.

* cited by examiner

*Primary Examiner*—Georgia Epps
*Assistant Examiner*—Tim Thompson
(74) *Attorney, Agent, or Firm*—Skjerven Morrill MacPherson LLP; Norman R. Klivans (57) ABSTRACT

A cell for mounting a lens includes a set of resilient mounting structures which can include a plurality of seats affixed to radial flexure mounts, a set of compliant soft mounts or a combination of the radial flexure mounts and soft mounts. The radial flexure mounts additionally include a pair of flexures extending at opposite ends of the flexure mount. The flexures permit the lens to radially expand and contract relative to the cell due to temperature changes. The seats are affixed to the flexure mounts to prevent torsional moments on the flexure mounts due to gravity or vibration. Additionally, there is no torsion moment on the radial flexure mounts due to radial expansion. The set of soft mounts include a spring member for distributing the gravitational load without overconstraining the lens.

8 Claims, 11 Drawing Sheets

KINEMATIC LENS MOUNTING WITH DISTRIBUTED SUPPORT AND RADIAL FLEXURE

BACKGROUND OF THE INVENTION

1. Field of the Invention

The present invention relates to a lens mounting structure and in particular a quasi-kinematically distributed peripheral lens mounting assembly for minimizing distortion of the lens due to gravity and temperature factors.

2. Description of Related Art

Designers of optical lens systems are developing more powerful, more accurate and hence more sophisticated systems for many applications, such as semiconductor lithography applications for producing semiconductor devices. These lens systems must be very accurate and must minimize distortion of each individual lens during assembly, storage and shipping of the systems, and further during operation of the lens systems due to temperature changes and due to the effects of gravity on both the individual lenses and the lens assemblies.

Each lens typically is mounted in a lens cell which is designed to provide uniform support for the individual lens and to minimize mechanical problems caused during assembly of the systems and those which can be caused due to temperature changes. Generally each lens is mounted in a separate lens cell which provides an annular support for the lens. The lens can be mounted in a variety of ways, such as by the utilization of mechanical elements for example, clamps, clips, screws, alone or combined with, retaining rings or adhesive, such as an epoxy. The stresses caused by the mounting elements, gravity and in particular, stress and distortion caused by expansion and contraction of the lens and cell due to temperature changes can seriously effect the optical characteristics and therefore the operation of the lens systems.

These undesirable effects are magnified by the mounting together of a plurality of the lens cells stacked on one another to form the lens system. The lens cells, which can include ten to twenty individual cells, are assembled together in a unitary fashion, typically in a lens barrel assembly. The assembly must precisely align and position each of the lenses and maintain the proper optical alignment within strict tolerances, both axially and radially. Preferably, the lenses individually are mounted in the cells and then the cells can be accurately assembled in the lens systems with a minimal effect on the optical surfaces of the individual lenses.

As stated, it is particularly desirable to minimize stress and distortion for the individual lenses and the lens mounting structures utilized in semiconductor lithography apparatus. Such apparatus is used to photolithographically form extremely small feature size structures in integrated circuits. These features are continuously being reduced in size to less than one micron, now commonly a fraction of a micron. Accordingly, even extremely small distortions in a lens of these lens systems can represent a significant accuracy/alignment problem in such precision applications.

An example of a structure for mounting a lens in a lens cell and then into a lens barrel assembly is disclosed in U.S. Pat. No. 4,733,945 issued to Bacich. Bacich adhesively bonds a lens to a cell at three seating points located on cantilever type flexures formed in the cell. As the cell and lens expand and contract relative to one another because of temperature variations, the cantilever flexures are intended to bend so that the lens does not become distorted due to mechanical stress. For some applications; however, the Bacich structure has several drawbacks. First, because Bacich's lens is mounted and supported by the cell at three peripheral locations, gravitational force can cause the lens to sag between the mounts. While the sagging problem could be addressed by adding more seats to the Bacich structure, adding such seats could cause additional problems. For example, adding additional seats may over-constrain the lens in the direction of the optical axis. Also, because of machining imperfections, the lens seats may not be coplanar, which also may introduce mechanical stress and distortion of the lens.

Another potential drawback of the Bacich design is that the cantilever type flexure is subjected to torsional stress due to loading in the direction of the optical axis. This reduces the stiffness of the lens seat in the optical axis direction, thereby reducing the natural frequency of vibration of the flexure. If the natural frequency of vibration is too low, this may promote undesirable vibration of the lens and hence distortion of the optical properties of the lens system. The cantilever flexures also have an asymmetrical shape which can cause some rotational torque on the lens when the flexures deflect.

Some prior cell designs utilize more than three radial flexures, which are attached to the lens with adhesive and without mechanical seats. This substantially eliminates machining tolerance induced errors, discussed above, but these designs still are sensitive to uneven heating and directly transfer cell distortions to the lens.

The prior mechanical clamping designs utilized with flexure structures constrain the radial compliance of the lenses. When adhesive is utilized, it can cause problems with outgassing, long-term stability, contraction and placement stability during curing, long assembly times due to long curing times and difficulty during disassembly, adjustment and reassembly.

It thus would be desirable to achieve mounting of a lens kinematically or quasi-kinematically in a cell with the lens support distributed around the periphery of the lens and a minimum amount of distortion and avoiding overconstraint due to the lens mounting structure, the gravity effects on the mounted lens and the stresses caused by temperature changes.

SUMMARY

A quasi-kinematic, distributed peripheral support lens mounting assembly for minimizing distortion of a lens due to gravity and temperature factors is provided by the present invention. The lens mounting assembly includes a cell for mounting a lens therein. A plurality of the cells can then be assembled together to form a lens system or lens barrel assembly. Each cell contains a set of seats affixed to radial flexure supports formed in the cell. The flexures permit the lens and cell to expand and contract differentially due to temperature changes, while minimizing forces on, and resulting distortion of the lens element. The center of the lens does not shift relative to the cell during uniform temperature changes. The seats are affixed to each radial flexure mount to prevent twisting or bending moments on the flexure due to gravity, differential expansion or vibration.

The lens preferably has three mounting seats evenly spaced around the lens. The seats are machined to match the surface contour (e.g., flat, conical spherical, etc.) of the lens. The size of each seat is minimized to reduce the overconstraint effects of non-matching surfaces without exceeding the allowable contact pressure of the lens material. Alternatively, a point contact could be used at the seat (e.g., flat seat on spherical lens, or convex seat on flat lens surface) to further reduce the possibility of overconstraint if the lens material can tolerate the contact stresses.

The cell also can include a set of soft mounts in addition to the seats for further distributing the gravitational load without overconstraining the lens. The soft mounts preferably are evenly spaced around the periphery of the lens, between the radial flexure mounts. The soft mounts are highly compliant and bear against one side of the lens to counteract the effects of gravity. Each soft mount is preloaded such that the force exerted against the lens is equal to the total weight of the lens divided by the combined number of seats and soft mounts. This ensures that the weight of the lens is carried equally by all the seats and soft mounts.

As the lens expands and contracts relative to the cell due to temperature variations, the tangent flexure mounts bend radially so that the lens is not subjected to high loads which can cause mechanical distortion. Each lens is affixed to each associated radial flexure mount on the seat positioned such that there substantially is no torsion moment on the flexures due to forces such as gravity or mechanical vibration. The lens seats are positioned substantially in the center of the flexure mounts so that there is no torsion moment on the flexures due to radial expansion. The flexures have a tangent flexure structure which prevents rotation of the lens due to differential expansion.

The lens is clamped to the lens seat without affecting radial compliance of the flexure mount. In one embodiment, a compliant clamp urges the lens against each seat. Because this clamp is compliant, the clamping force which clamps the lens against the cell seat is relatively insensitive to machining tolerances, assembly techniques and temperature variations. The compliant clamp also minimizes radial or tangential forces or moments on the lens. This mechanical clamp also allows repeated assembly and disassembly of the cell without having to apply or break adhesive bonds.

BRIEF DESCRIPTION OF DRAWINGS

Utilization of the same reference numerals in different Figures indicates similar or identical elements, structurally and/or functionally.

DETAILED DESCRIPTION OF THE PREFERRED EMBODIMENTS

Figure 1:
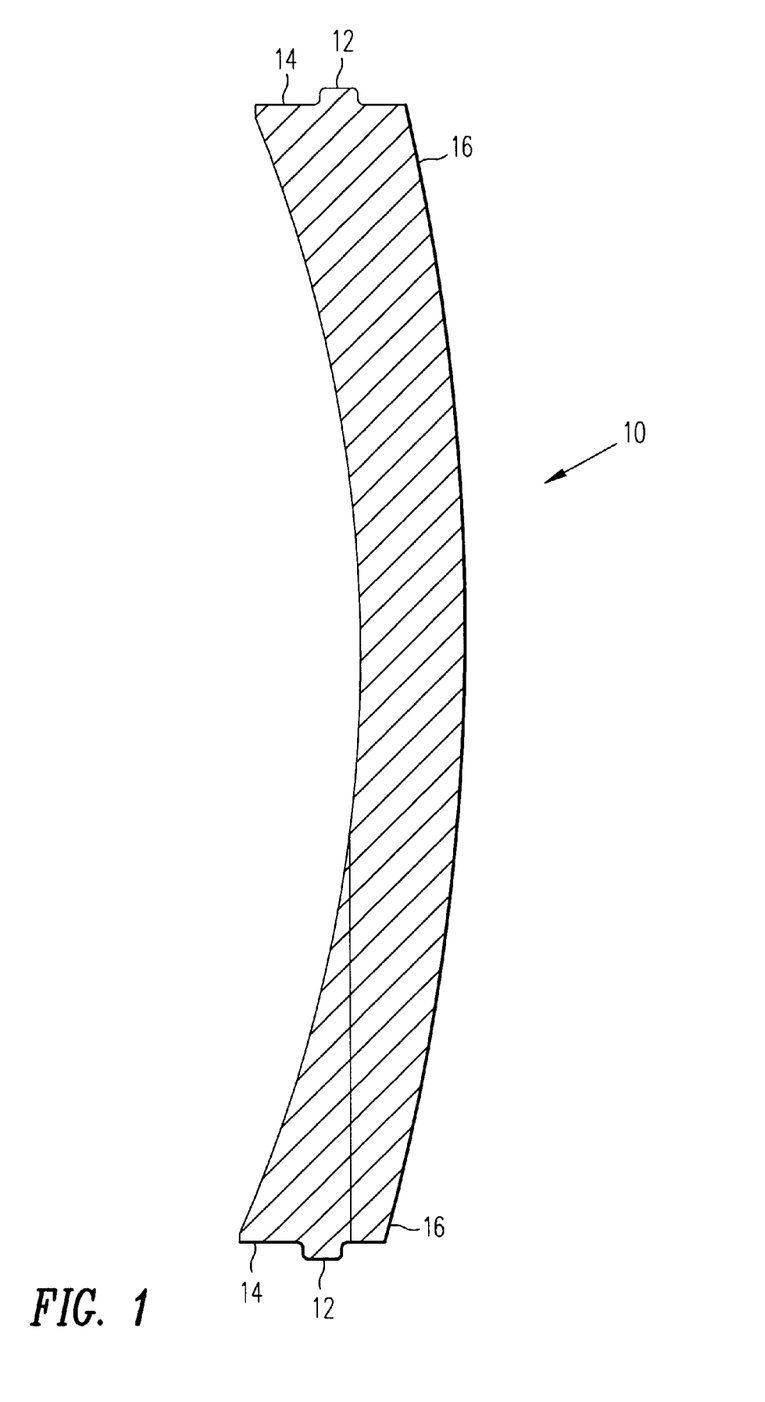
FIG. 1 illustrates a cross section of one embodiment of a lens to be quasi-kinematically mounted in a cell in accordance with the present invention.

Referring to FIG. 1, one embodiment of a lens 10 is illustrated in cross-section. In one embodiment, the lens 10 can be utilized in a semiconductor lithography apparatus (not illustrated). The lens 10 typically has a diameter D on the order of two hundred (200) to three hundred (300) mm (about 12 inches), and weighs on the order of between 1 and 5 Kg. However, other sizes and weights can be utilized and are contemplated in the scope of the present invention. The lens 10 preferably includes a circumferential ridge 12 formed on a peripheral edge 14 thereof. The ridge 12 is not required, but is advantageous to increase the useful optical surface of the lens 10, to substantially reduce optical deformation of the edge of the lens 10 due to mechanical clamping force, and to eliminate radial components of clamping forces on the lens 10. In the prior art, the lens is often clamped or secured on a peripheral surface portion 16 of the lens, which blocks the optical surface of the periphery of the lens, can deform the lens surface and, because the lens surface which is clamped at the peripheral surface portion 16 is curved, imparts a radial force on the lens which also can cause distortion. Because the lens 10 is held and clamped on the ridge 12, any deformation and distortion of the lens 10 optical path caused by the mechanical clamping, described hereinafter is minimized.

Figures 2A, 2B, 2C:
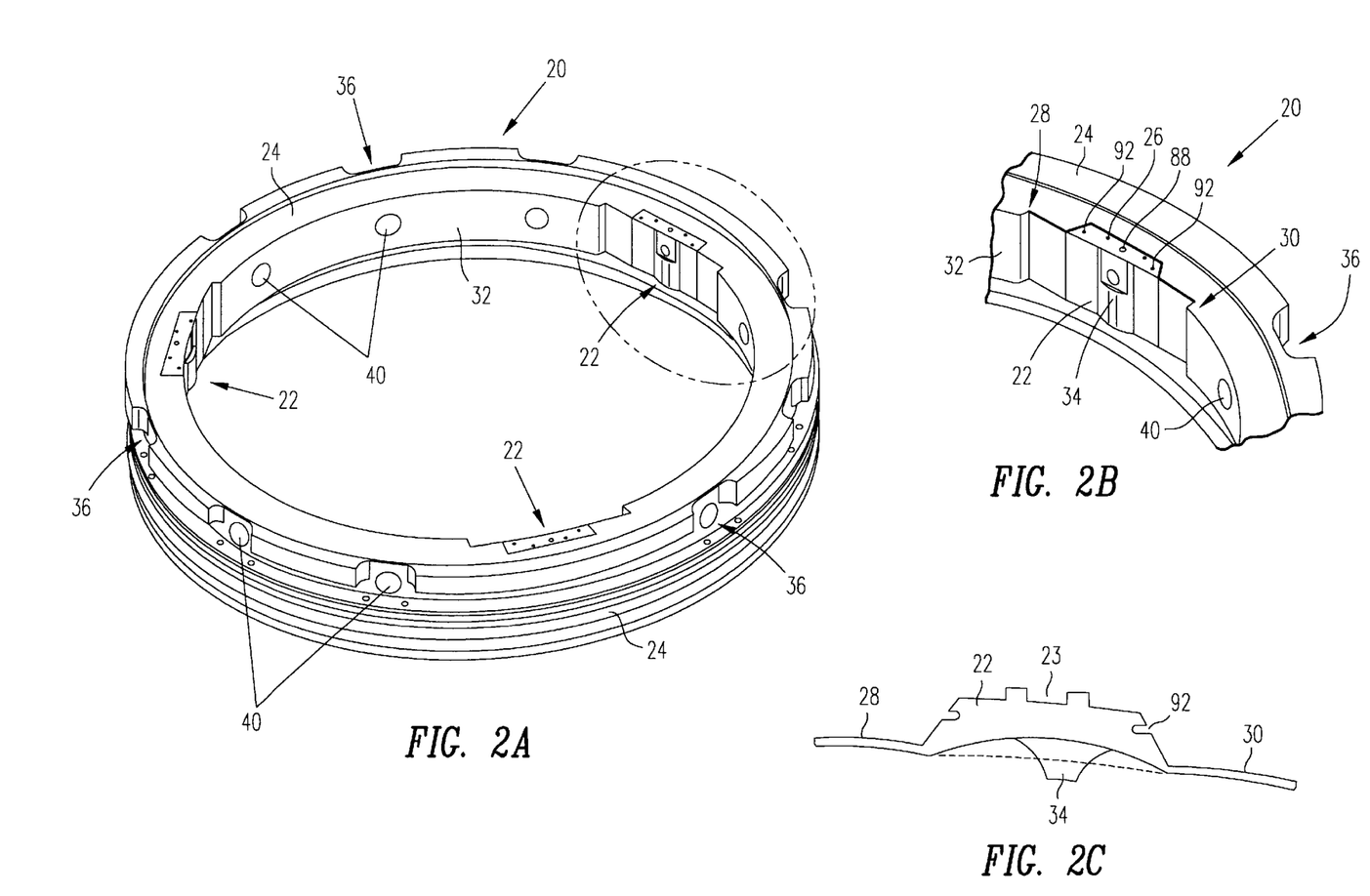
FIG. 2A illustrates a perspective view of one embodiment of a cell for mounting the lens in accordance with the present invention.
FIG. 2B illustrates an enlarged partial perspective view of the cell of FIG. 2A.
FIG. 2C illustrates an enlarged top view of a radial flexure mount in accordance with the present invention.

Referring to FIGS. 2A–2C, a first embodiment of an improved cell 20 for mounting the lens 10 is illustrated. The cell 20 is formed from a precision material, such as brass, which forms a very stable mounting structure for the lens but also can be precision machined where desired. The cell 20 includes a plurality of radial flexure mounting structures 22 onto which the lens 10 is mounted. Each radial flexure mount 22 is separated from a main body or ring 24 of the cell 20 along a slot 26 formed in the body 24. The radial flexure mount 22 is still integrally connected to the body 24 via flexures 28, 30 at opposite ends of the radial flexure mount 22. The radial flexure mounts 22 are formed on an inner wall 32 of the cell body 24. Preferably there are three (3) radial flexure mounts formed on the wall 32 of the cell 20. Each of the radial flexure mounts 22 includes a lens seat 34 formed integrally or attached to the midpoint of the radial flexure mount 22. This center mounting position substantially eliminates any torsion moment on the radial flexure mount 22 due to the differential radial expansion of the lens 10 and the cell body 24. The flexures 28, 30 are constructed as coplanar thin flat plates so that the radial flexure mount 22 has low radial stiffness and high tangential and axial (vertical) stiffness. In addition, the flexures 28, 30 are positioned so that a planed defined by the flexures 28, 30 intersects the approximate center of the seat 34, as shown in FIG. 2C. This A positioning prevents tangential and axial (vertical) forces from creating moments on the radial flexure mount 22. The radial flexure mount 22 additionally includes a locator slot 23 into which a spring assembly, described hereinbelow, can be mounted. This radial flexure mounting 22 structure provides a desirable three (3) point mounting platform for the lens 10.

Figures 3, 3A:
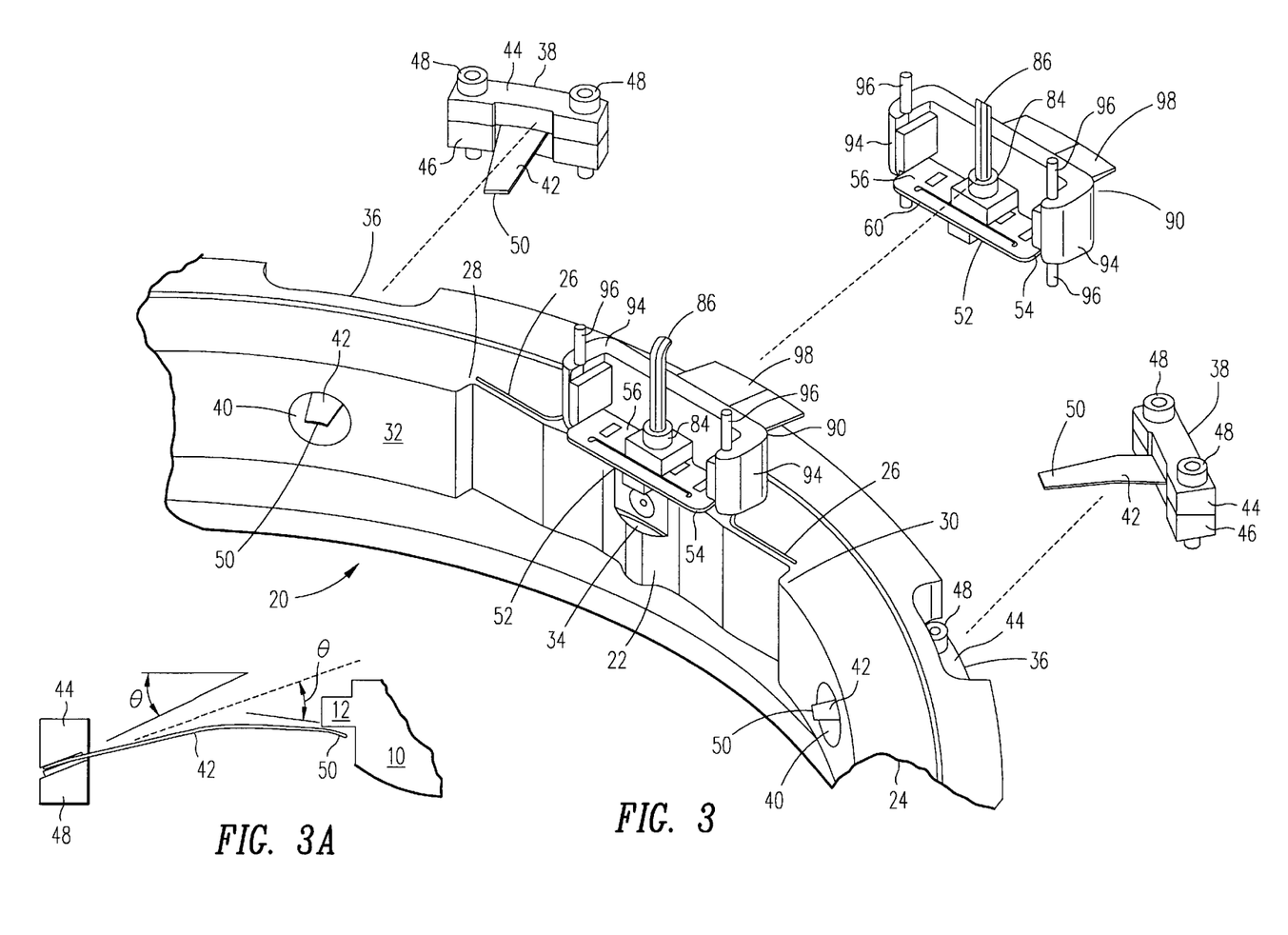
FIG. 3 illustrates an exploded partial perspective view of the cell and supports of FIG. 2A.
FIG. 3A is an enlarged partial cross-sectional view illustrating the soft mount of FIG. 3 supporting a lens.

The cell body 24 also includes a plurality of soft mount cutouts 36, which are utilized with a plurality of soft mounts or supports 38, as illustrated in FIG. 3. Each of the cutouts 36 communicate with the interior of the cell body 24 through respective passageways 40. Each soft mount 38 includes a resilient tongue or blade spring 42 which is sized to extend through the passageway 40 when mounted on the cutout 36. The blade 42 is held between an upper block 44 and a lower block 46, which are clamped together by securing devices, such as bolts 48. The blades 42 are positioned at an angle θ, defined by the blade 42 and a plane orthogonal to the inner wall 32 of the cell body 24, such that when the blades are deformed by a desired fraction of the lens 10 weight, a tip portion 50 of the blade 42 is parallel to the surface of the ridge 12 on the lens 10. This is illustrated in FIG. 3A. The bolts 48 also are utilized to mount the soft mounts 38 in the cutouts 36. The tip portion 50 of the blade 42 extends through the passageway 40 and forms a plurality of support members for the lens 10, in addition to the radial flexure mount seats 34.

Figure 4:
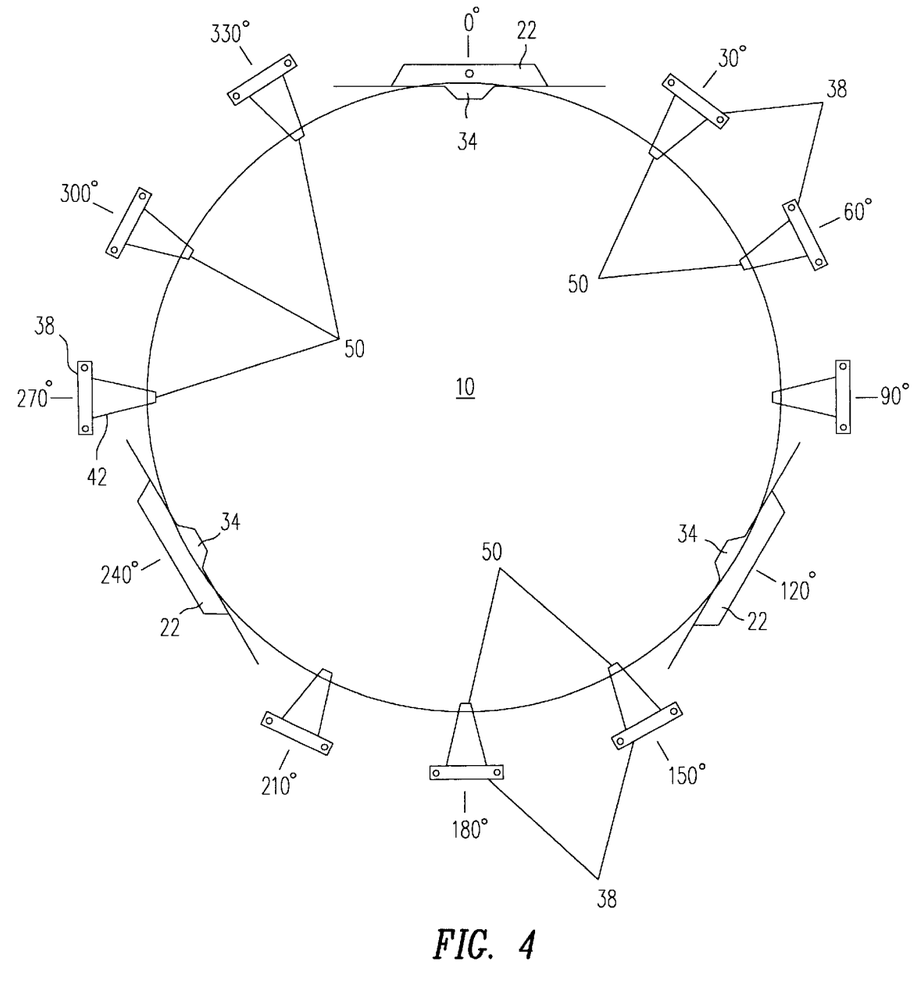
FIG. 4 illustrates a diagrammatic top view of the lens mounted in the cell by a plurality of soft supports along with three radial flexure lens supports.
Figure 5:
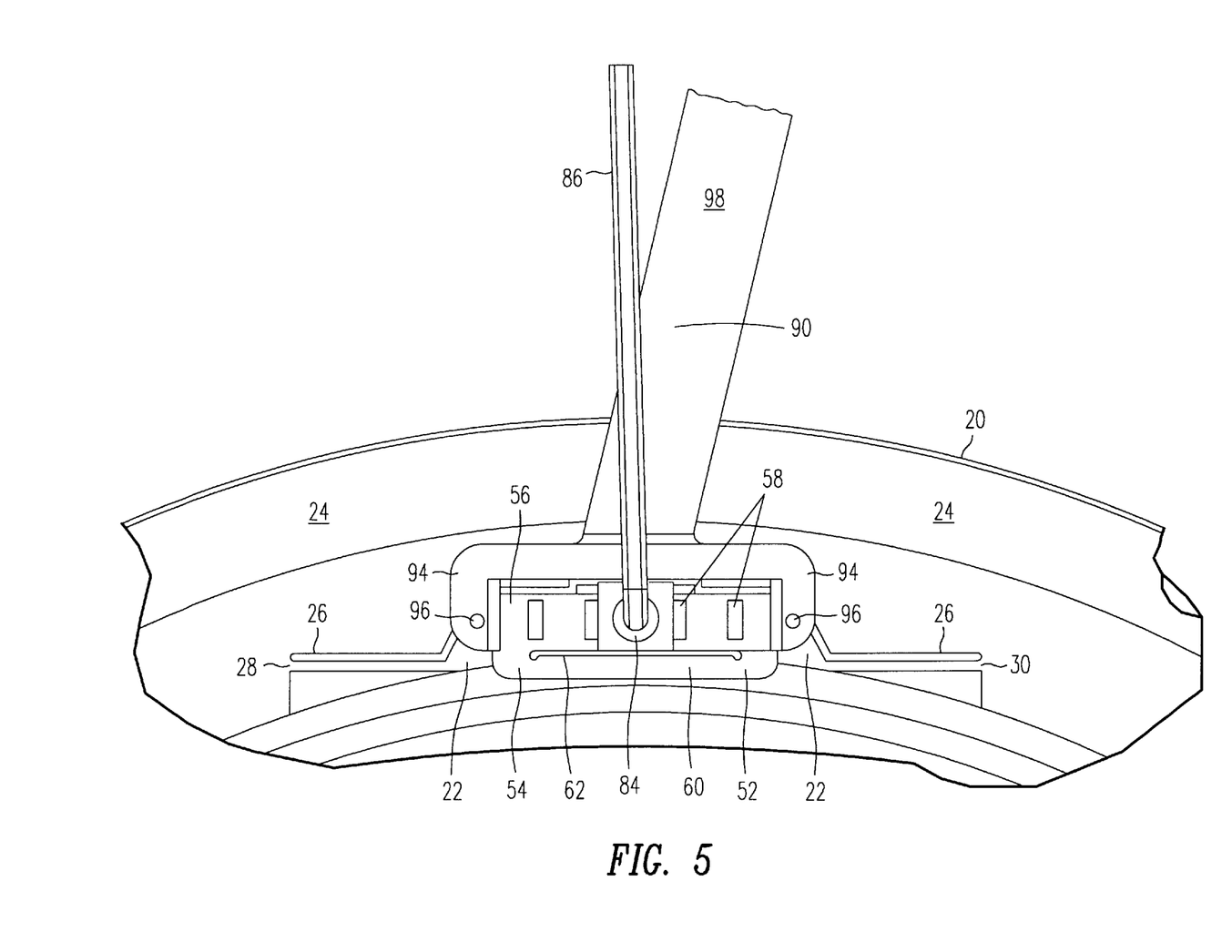
FIG. 5 illustrates the operation of a tool utilized to mount the lens in the radial flexure supports without causing distortion.
Figure 6A:
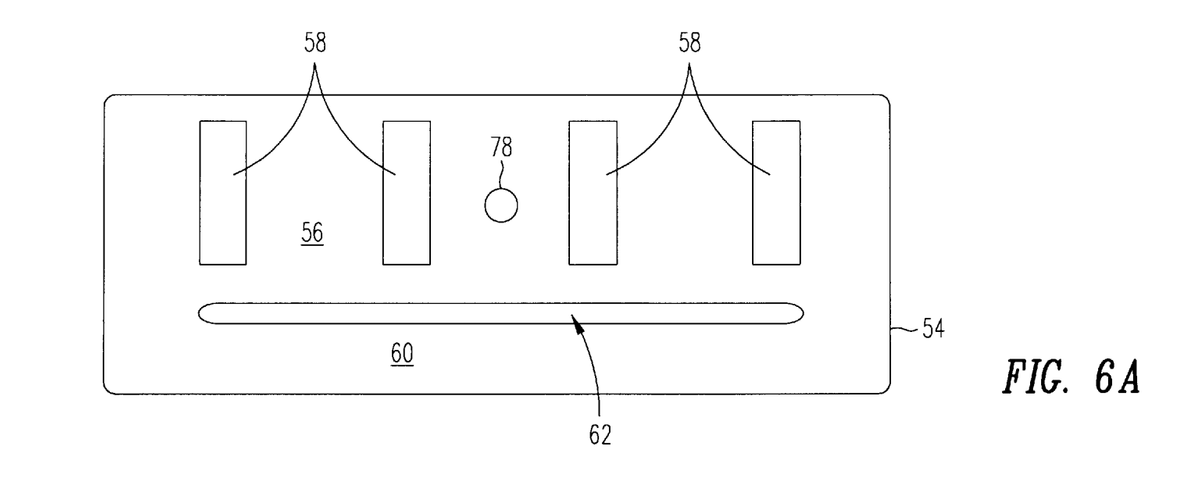
FIGS. 6A–C illustrate one embodiment of a clamping spring which clamps the lens against the flexure supports.
Figure 6B:
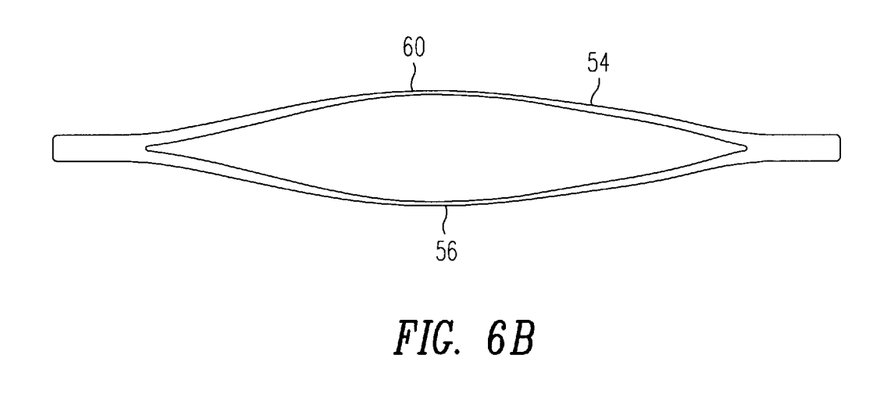
Figure 6C:
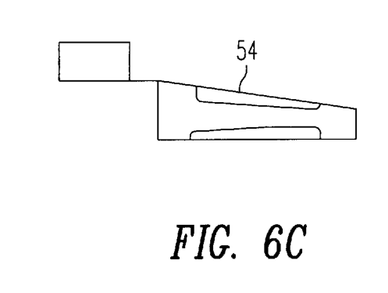

A set of the soft supports 38 are selected for distributing the gravitational load without overconstraining the lens. In one preferred embodiment, as illustrated in FIG. 4, the soft supports include a set of nine (9) cantilever blades 42 for supporting a portion of the weight of the lens 10 in the optical axis direction. The cantilever blades 42 are compliant in the optical axis direction. Therefore, they do not overconstrain the lens positioning as determined by the three seats 34 on the radial flexure mounts 22. Instead, the blades 42 simply provide more distributed support of the lens 10 to counter any distortion due to gravity. An additional advantage of the soft mounts' compliance is the low sensitivity of supporting force to mechanical machining tolerances. Also, if the cell 20 is distorted, e.g., because it is pressed against a non-flat surface, the cell distortion will not cause a corresponding significant lens distortion. Specifically, even if cell distortion alters the location of one of the lens seats 34, because the lens 10 is not overconstrained in the optical direction, any resulting distortion of the lens 10 will be minimized.

Preferably, the soft mounts 38 should also be compliant in the radial direction to allow differential expansion. Cantilever springs are not compliant in the radial direction and can therefore create undesirable radial forces. The maximum undesirable force on the lens 10, however, is limited by the low contact force and the coefficient of friction between the cantilever spring tip 50 and the lens 10. Alternative soft mount springs are possible, including compressed or extended coil springs, magnets, or other suitable springs, which may or may not have radial compliance.

The set of nine (9) soft mount blades 42 are evenly spaced in sets of three (3) between each of the three (3) radial flexure mounts 22, as illustrated in FIG. 2A and diagrammatically in FIG. 4. This distributes the load and provides along with the seats 34 a nearly symmetrical lens support, with each blade 42 and each seat 34 designed to support one twelfth of the gravitational load of the lens 10. Other sets of soft supports 38 also could be utilized, such as three (3), six (6), or more, which can also be evenly spaced with the seats 34.

While the lens 10 rests on the tip portions 50 of the blades 42, the lens 10 preferably is mechanically clamped to the radial flexure mounts 22 by a spring assembly 52. The spring assembly 52 is illustrated in FIGS. 3, 5, 6A–C and 7. The spring assembly 52, includes a spring member 54, best illustrated in the deformed state in FIGS. 6A–C. The spring member 54 includes a first spring portion 56, which is designed to bow in one direction with a plurality of slots 58. The portion 56 is separated from a second oppositely bowed spring portion 60 by a longitudinal slot 62.

Figure 7:
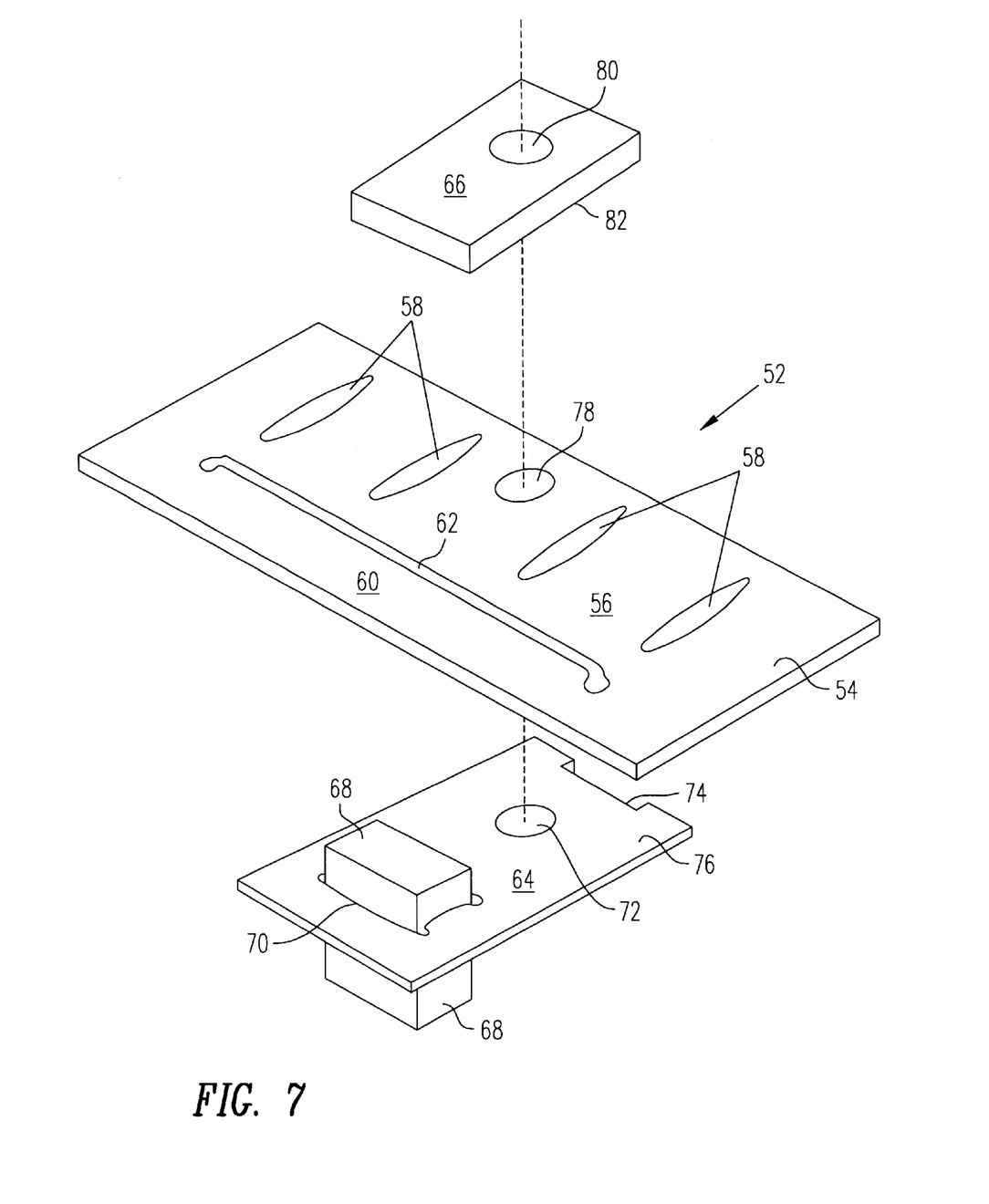
FIG. 7 is an exploded perspective illustration of the clamping spring assembly.

The spring assembly 52, best illustrated in FIG. 7, includes the member 54, a locator plate 64, a clamping block 66 and a spacer block 68. The plate 64 includes an aperture 70 for locating spacer block 68, a mounting aperture 72 and a locator slot 74 in an end 76. The spring member 54 and the block 66 include matching mounting apertures 78, 80. The block 66 further includes a depending locating portion 82, which bears against the member 54 and fits into the locator slot 74, when the spring assembly 52 is mounted onto the radial flexure mount 22. When the spring assembly 52 is mounted onto the radial flexure mount 22, the locating portion 82 of the clamping block 66 fits into the locator slot 23 of the radial flexure mount. The spring assembly 52 is secured together and mounted with a bolt 84, such as a hex socket head bolt as illustrated. The spring assembly 52 is mounted utilizing the bolt 84 and an appropriate wrench 86, which is utilized to tighten the bolt into a threaded passageway 88 (FIG. 2B) in the radial flexure mount 22. To avoid placing torque on the radial flexure mount 22 or the lens 10, an anti-torque tool 90 is engaged into a pair of apertures 92 (FIGS. 2B and 2C) formed in the top of the radial flexure mount 22. The tool 90 includes a pair of arms 94, each of which include a pin or rod 96 which matches the apertures 92 and is engaged therein to prevent stress when the bolt 84 is tightened. The tool 90 includes a handle 98 from which the arms 94 extend and which is utilized to maintain the spring assembly 52 in the proper location during assembly and disassembly.

Figure 8:
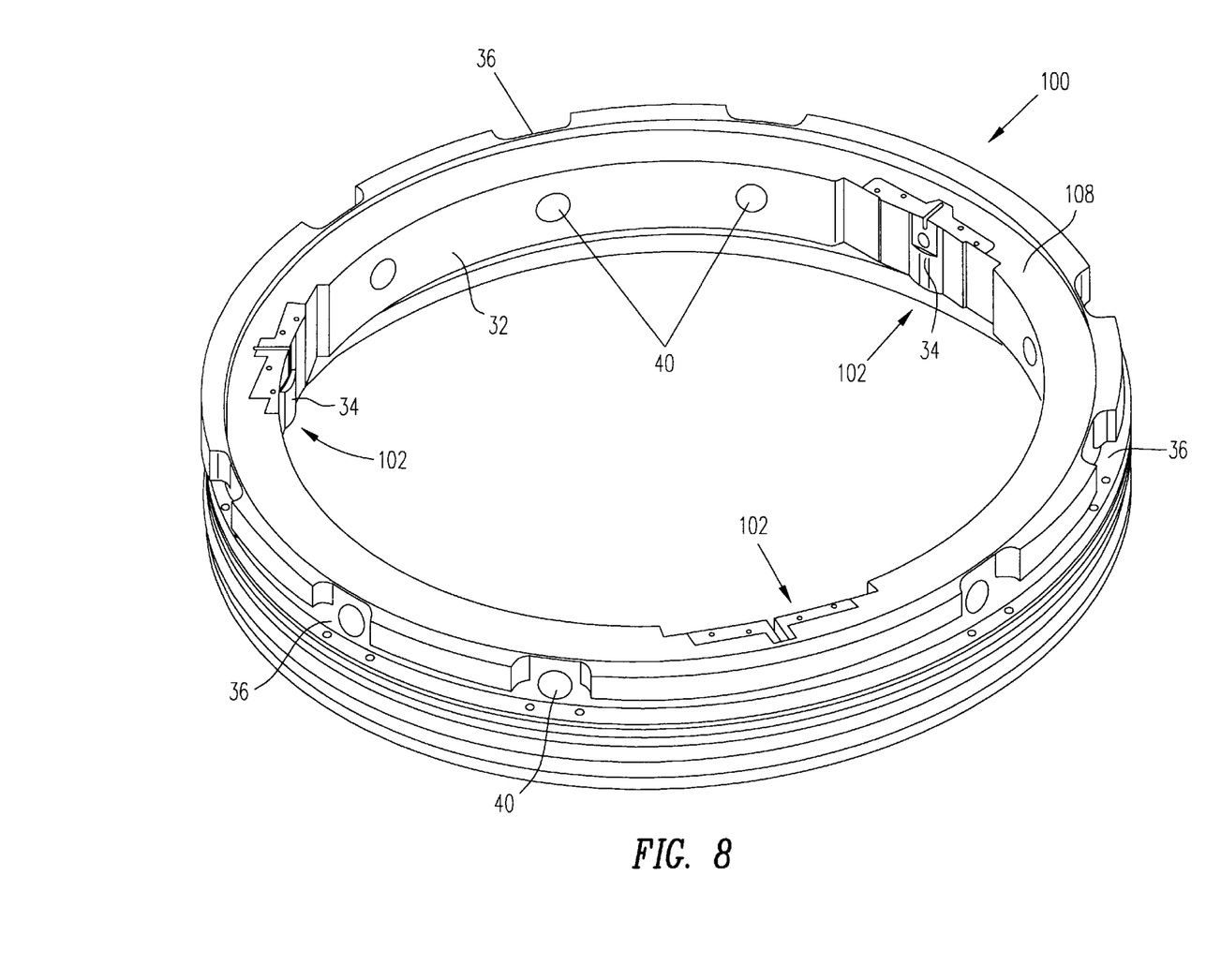
FIG. 8 illustrates a second alternative embodiment of a lens cell.
Figure 9A:
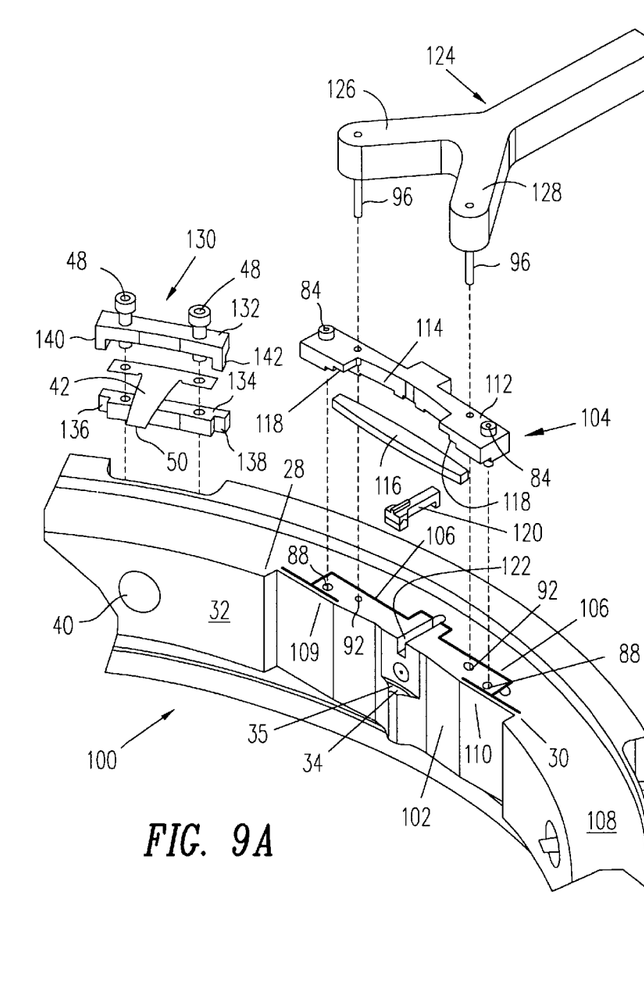
FIGS. 9A and 9B are exploded partial views of the lens cell of FIG. 8, illustrating the assembly thereof.
Figure 9B:
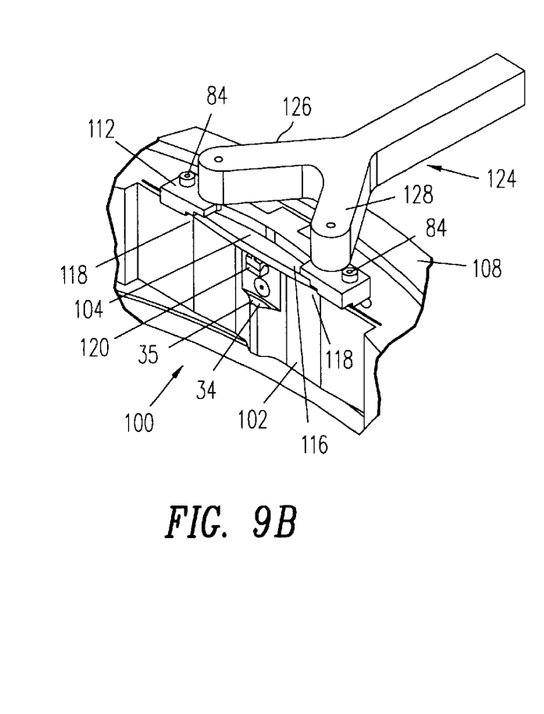

Referring to FIGS. 8, 9A and 9B, a second embodiment of an improved lens cell 100 of the present invention is illustrated. The cell 100 is very similar in overall structure to the cell 20 and the same numerals are utilized to indicate the same or functionally the same elements, describing in detail only the major differences in the cell 100 and the mounting structure thereof. The cell 100 has a plurality of radial flexure mounts 102, which are very similar to the radial flexure mounts 22, but are formed to support a different spring assembly 104. The spring assembly 104 is functionally similar to the spring assembly 52, however, the spring assembly 104 differs in structure as described below.

The radial flexure mounts 102 include the lens seats 34 as before. Additionally, the radial flexure mount 102 and flexures 109, 110 are formed by a slot 106 in a cell body 108, as in the above described embodiment. In this second embodiment, however, a leaf-type clamping spring 116 provides the clamping force on the lens 10. The clamping spring assembly 104 includes an elongated clamping block 112, which has a notch 114 formed in one side thereof to accommodate the mounting and flexing of the leaf-type spring blade member 116.

Figure 10:
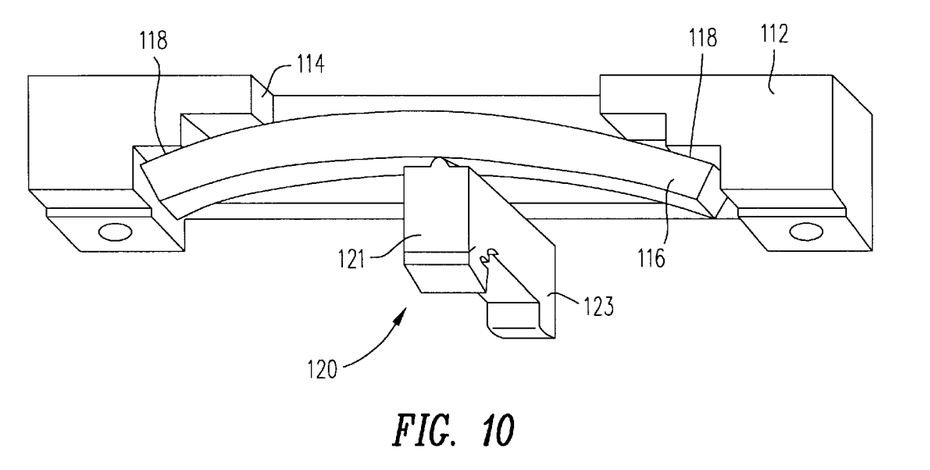
FIG. 10 is an enlarged perspective view illustrating a second embodiment of a clamping spring assembly according to the present invention.

As shown in FIG. 10, the spring member 116 is mounted into a second notch 118, which is formed in the bottom of the block 112 and extends beyond the notch 114. The spring member 116 resiliently biases a lens clamp block 120 having top and bottom arms 121, 123 to clamp the lens 10 (not illustrated) into the seat 34. The block 120 is slidingly engaged in an alignment slot 122, which is formed in the radial flexure mount 102. The clamping spring assembly 104 is mounted onto the radial flexure mount 102 utilizing a pair of bolts 84, which are threaded into mating threaded passageways 88 formed in the top of the radial flexure mount 102.

Figure 11:
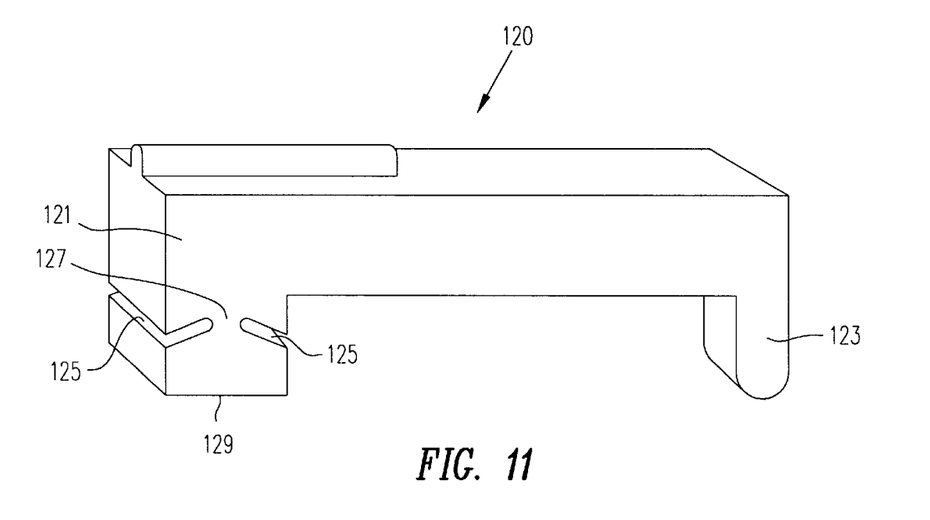
FIG. 11 is an enlarged side perspective view illustrating details of the lens clamp block shown in FIG. 10.

As shown in greater detail in FIG. 11, the lens clamp block 120 has two slots 125 formed on an upper and lower surface of the top arm 121, which define a flexural hinge 127. The flexural hinge 127 allows a lens contacting surface 129 of the lens clamp block 120 to conform to the lens 10 when clamped, so that small variations in the mechanical dimensions of the lens 10 or the radial flexure mount 102 do not prevent surface contact of the clamp.

Referring back to FIG. 9A, the clamping spring assembly 104, again is mounted with the bolts 84, while aligned against torque stresses utilizing an anti-torque tool 124. The tool 124 again has a pair of arms 126, 128, each of which include the depending rod 96, which again are engaged into the apertures 92 formed in the radial flexure mount 102. The tool 124 again substantially eliminates torque stresses during assembly and diassembly of the clamping spring assembly 104 on the radial flexure mount 102.

The lens cell 100 also preferably includes a plurality of soft mounts 130, which are functionally equivalent to the soft mounts 38 described above with respect to the first embodiment. The mounts 130 include the blade 42, clamped by a pair of the bolts 48 inserted through a pair of dove-tailed blocks 132 and 134. One of the pair of blocks 134 includes a pair of end notches 136, 138 which are mated with a pair of complementary fingers 140, 142 formed on the other of the pair of blocks 132. The dove-tailed structure formed by the blocks 132, 134 insure that the blocks 132, 134 and blade spring 42 do not slip relative to each other when the bolts 48 are tightened.

As described, the present invention includes a mechanically clamped lens 10 which is constrained quasi-kinematically around the perimeter 16 of the lens. The cell 20 or 100 provides a three point mounting on small area seats 34 to avoid any substantial overconstraint of the lens 10 by the flat surface contact provided by the seats 34. Each of the seats 34 are part of the radial flexure mounts 22 or 102 which allow radial differential expansion of the lens 10, but which are stiff both vertically and tangentially to maintain a high mounting stiffness of the lens 10 which provides the desirable high frequency resonant modes.

The spring assembly 52 or 104 mechanically clamps the lens 10 directly above the seats 34 to eliminate any potential moments caused by offsets between the clamp and seat forces. By mechanically clamping the lens 10, the problems inherent in adhesives of outgassing and destructive disassembly are avoided. By providing the spring assembly 52 or 104 with the compliant clamping mechanism disclosed, the clamping force is applied substantially uniformly and constantly, despite some potential mechanical and dimensional differences due to mechanical tolerances. The clamping mechanisms are attached to the radial flexure mounts 22 or 102 to prevent overconstraint of the lens 10 due to differential expansion of the lens 10 and cell 20 or 100.

In an alternative arrangement to that described above, the locations of the spring assembly 52 or 104 and the lens seat 34 can be changed to other places on the lens cell 20 or 100. For example, each lens seat 34 can be provided on the inner wall 32 with the spring assembly 52 or 104 provided above the lens seat 34. In this arrangement, the radial flexure mounts 22 or 102 function only to provide radial alignment.

The addition of the soft mounts 38 or 130 to the support structure provided by the radial flexure mounts 22 and 102 further spreads the gravitational load from the three seats 34 to an additional number of points, preferably twelve as described. The applicants have analyzed the lens loading and have determined that the twelve peripheral support points on the lens 10 provide substantially optimum performance for prevention of gravity deformation. Those skilled in the art would recognize that larger and/or thinner lenses or more stringent lens deformation specifications may require additional soft mounts. The blades 42 of the soft mounts 38 or 130, preferably are highly compliant cantilever-type springs formed from a flat material (e.g., metal, ceramic or other suitably flat material) of very precise thickness. The precise thickness minimizes the stiffness variation between the blades 42. Any variation in thickness also can be compensated by varying the width of the blades 42 to maintain the desired uniformity in stiffness. The slots 26 and 106, as well as the blades 42 preferably are formed by utilizing wire electron discharge machining (EDM), which is very precise and does not create internal stresses in the material. Alternatively, the blades 42 could be replaced by coil springs or other types of biasing mechanisms (not illustrated).

The lens mounting structure according to principles of the present invention is applicable in a photolithography system (exposure apparatus) such as a scanning type photolithography system which exposes a mask pattern on a substrate by moving a mask, held on a mask stage, and a substrate, held on a substrate stage, synchronously (see U.S. Pat. No. 5,473,410). Additionally, the present invention is applicable to a step-and-repeat type photolithography system that exposes a mask pattern while a mask and a substrate are stationary and moves the substrate in successive steps. Further, the present invention can also be applied to a proximity photolithography system that exposes a mask pattern by closely locating a mask and a substrate without the use of a projection optical system.

The use of a photolithography system need not be limited to a photolithography system in semiconductor manufacturing. For instance, it can be widely applied to an LCD photolithography system which exposes a liquid crystal display device pattern onto a rectangular glass plate and a photolithography system for manufacturing a thin film magnetic head.

In terms of a light source for the photolithography system according to the present invention, not only g-line (436 nm), i-line (365 nm), KrF excimer laser (248 nm), ArF excimer laser (193 nm) and $F_2$ laser (157 nm) can be used, but also charged particle beams such as x-ray and electron beam can be used. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of a projection optical system included in the photolithography system, the system need not be limited to a reduction system. It could also be a 1× or magnification system.

With respect to a projection optical system, when far ultra-violet rays such as the excimer laser is used, glass materials such as quartz and fluorite that transmit far ultra-violet rays is preferable to be used. When the $F_2$ type laser or x-ray is used, the optical system should preferably be either catadioptric or refractive (a reticle should also preferably be a reflective type), and when an electron beam is used, electron optics should preferably consist of electron lenses and deflectors. Needless to say, the optical path for the electron beams should be in a vacuum.

Further, in photolithography systems, when linear motors (see U.S. Pat. Nos. 5,623,853 or 5,528,118) are used in a substrate stage or a mask stage, the linear motors can be either an air levitation type employing air bearings or a magnetic levitation type using Lorentz force or reactance force. Additionally, the stage could move along a guide, or it could be a guideless type stage which uses no guide.

Alternatively, the stage could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese patent JP Hei 8-166475. Additionally, reaction forces generated by the reticle (mask) stage motion can be mechanically released to the floor (ground) by use of a frame member as described in U.S. Pat. No. 5,874,820 and published Japanese patent JP Hei 8-330224.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and cleanliness are controlled.

Figure 12:
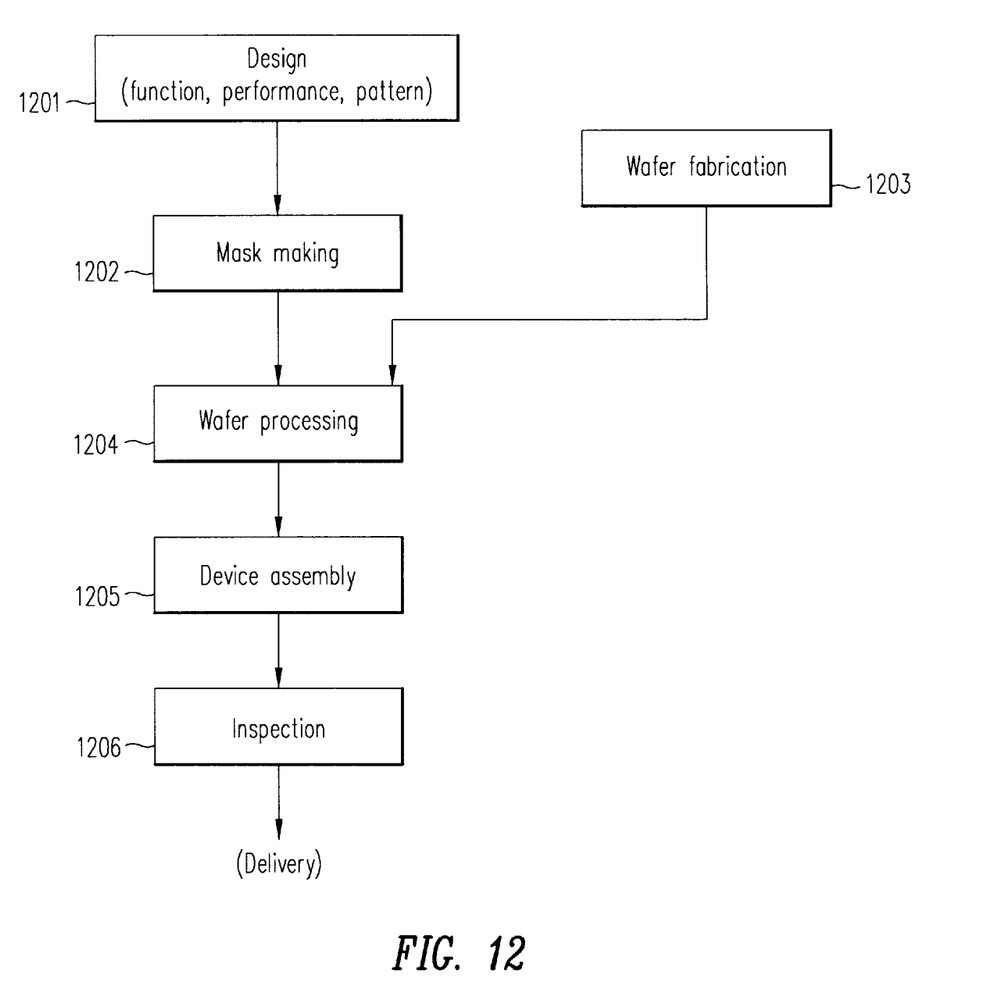
FIG. 12 is a flowchart showing a method for fabricating semiconductor devices by an apparatus according to the present invention.

Further, semiconductor devices can be fabricated using the above described systems, by the process shown generally in FIG. 12. In step 1201 the device's function and performance characteristics are designed. Next, in step 1202, a mask (reticle) having a pattern is designed according to the previous designing step, and in a parallel step 1203 a wafer is made from a silicon material. The mask pattern designed in step 1202 is exposed onto the wafer from step 1203 in step 1204 by a photolithography system described hereinabove in accordance with the present invention. In step 1205 the semiconductor device is assembled (including the dicing process, bonding process and packaging process), then finally the device is inspected in step 1206.

Having thus described the invention in considerable detail with reference to certain preferred embodiments thereof, it will be appreciated that other embodiments are possible. It will be understood by those skilled in the art that many changes in construction of the invention will suggest themselves without departing from the spirit and scope of the invention. Therefore, the spirit and scope of the appended claims should not be limited to the description of the preferred embodiments contained therein.

What is claimed is:

1. A structure for mounting a lens, comprising:
    a lens cell member capable of holding the lens around a periphery thereof;
    a plurality of radial flexure mounts affixed to the lens cell member, each radial flexure mount including a pair of flexures extending at opposite ends of the radial flexure mount and a seat affixed to the radial flexure mount for mounting the lens periphery; and
    a plurality of soft mounts disposed between adjacent radial flexure mounts, each soft mount including a resilient support contacting the lens periphery to support at least part of the weight of the lens,
    wherein ends of the pair of flexures are fixed to the lens cell member and the flexures can bend radially to accommodate expansion or contraction of the lens cell member due to temperature changes while minimizing stress on the lens.

2. The structure of claim 1, wherein the soft mounts include a cantilever blade member resiliently supporting a portion of the weight of the lens on the periphery thereof.

3. The structure of claim 1, wherein the soft mounts include a spring member resiliently supporting a portion of the weight of the lens on the periphery thereof.

4. The structure of claim 1, wherein each seat extends from a midpoint of the radial flexure mount such that the lens rests against the seat at a location in the plane of the flexures so that axial motion of the lens does not exert adverse effects on the radial flexure mounts.

5. The structure of claim 1, wherein the radial flexure mounts include a spring assembly mounted thereon to resiliently clamp the lens onto the seat.

6. An exposure apparatus which transfers a pattern onto a substrate, the exposure apparatus including the lens mounting structure of claim 1.

7. A structure for mounting a lens comprising:
    a lens cell member capable of holding the lens;
    a plurality of radial flexure mounts integrally formed with the lens cell member, each radial flexure mount having a seat formed thereon for mounting the lens and a pair of flexures extending at opposite ends thereof; and
    a spring assembly mounted on each of the radial flexure mounts, each spring assembly including a compliant clamp for securing the lens on the seat, wherein the flexures enable the radial flexure mounts to radially bend to accommodate expansion or contraction of the lens cell member due to temperature changes.

8. A structure for mounting a lens comprising:
    a lens cell member capable of holding the lens; and
    a plurality of mounts for supporting at least a portion of the weight of the lens, the mounts being compliant in the optical axis direction of the lens so that the structure is substantially insensitive to misalignment of the mounts in the optical axis direction;
    wherein the mounts each include a compliant structure which bears against a periphery of the lens and does not substantially constrain the lens in a radial direction of the lens; and
    wherein each compliant structure includes at least one spring member for supporting at lease a portion of the weight of the lens.

* * * * *